United States Patent [19]

Okutomo et al.

[11] Patent Number: 5,612,259
[45] Date of Patent: Mar. 18, 1997

[54] METHOD FOR MANUFACTURING A SEMICONDUCTOR DEVICE WHEREIN A SEMICONDUCTOR CHIP IS MOUNTED ON A LEAD FRAME

[75] Inventors: Takayuki Okutomo; Morihiko Ikemizu, both of Kawasaki, Japan

[73] Assignee: Kabushiki Kaisha Toshiba, Kawasaki, Japan

[21] Appl. No.: 500,066

[22] Filed: Jul. 16, 1995

Related U.S. Application Data

[62] Division of Ser. No. 277,206, Jul. 19, 1994, abandoned.

[30] Foreign Application Priority Data

Jul. 29, 1993 [JP] Japan .................................. 5-187981
Jun. 22, 1994 [JP] Japan .................................. 6-140352

[51] Int. Cl.⁶ .................................................. H01L 21/60
[52] U.S. Cl. .................. 437/209; 437/214; 437/217; 437/219; 437/220
[58] Field of Search .................................. 437/209, 206, 437/211, 214, 215, 217, 218, 219, 220; 257/666, 668, 676, 691

[56] References Cited

U.S. PATENT DOCUMENTS

| | | | |
|---|---|---|---|
| 4,812,421 | 3/1989 | Jung et al. | 437/211 |
| 4,857,483 | 8/1989 | Steffen et al. | 437/209 |
| 4,870,476 | 9/1989 | Solstad | 357/80 |
| 5,070,390 | 12/1991 | Shimizu | 357/80 |
| 5,073,817 | 12/1991 | Ueda | 357/81 |
| 5,172,214 | 12/1992 | Casto | 257/676 |
| 5,173,766 | 12/1992 | Long et al. | 257/668 |
| 5,214,845 | 6/1993 | King et al. | 257/668 |
| 5,231,303 | 7/1993 | Kasahara et al. | 257/669 |
| 5,357,139 | 10/1994 | Yaguchi et al. | 257/666 |
| 5,359,222 | 10/1994 | Okutomo et al. | 257/691 |
| 5,409,866 | 4/1995 | Sato et al. | 437/217 |
| 5,442,232 | 8/1995 | Goto et al. | 257/668 |

*Primary Examiner*—Kevin Picardat
*Attorney, Agent, or Firm*—Finnegan, Henderson, Farabow, Garrett & Dunner, L.L.P.

[57] ABSTRACT

In a semiconductor device and a method for manufacturing the same according to the present invention, each of electrode pads on a semiconductor chip is bonded to an inner lead section of each of leads of a carrier tape by a connecting electrode. An insulating film of the carrier tape is then adhered to the surface of the semiconductor chip by interposing an adhesive layer between them. Thus, the electrode pads and inner lead sections are stably bonded, and the flatness of the carrier tape is maintained by the flatness of the surface of the semiconductor chip. It is thus possible to prevent the flatness of the outer lead sections of the leads from being degraded when the number of leads is small, and to improve in mounting the semiconductor chip by reflow soldering.

21 Claims, 9 Drawing Sheets

METHOD FOR MANUFACTURING A SEMICONDUCTOR DEVICE WHEREIN A SEMICONDUCTOR CHIP IS MOUNTED ON A LEAD FRAME

This is a division of application Ser. No. 08/277,206, filed Jul. 19, 1994, now abandoned.

BACKGROUND OF THE INVENTION

1. Field of the Invention

The present invention relates to a semiconductor device formed by mounting a semiconductor chip on a lead frame and a method for manufacturing the same and, more particularly, to a TCP (tape carrier package) type semiconductor device which is improved in mounting on a printed circuit board by reflow soldering.

2. Description of the Related Art

Figure 1:
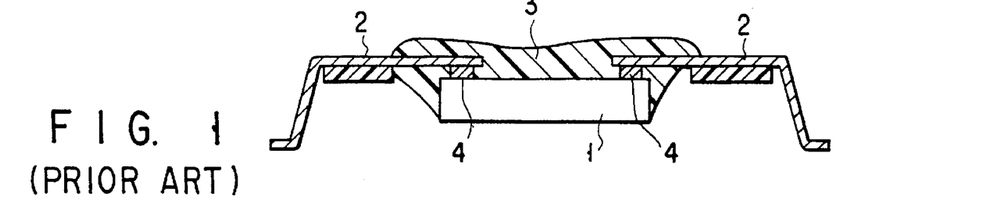
FIG. 1 is a cross-sectional view schematically showing a constitution of a conventional TCP type semiconductor device, for explaining the problem of the conventional semiconductor device.

Conventionally, as shown in FIG. 1, a TCP type semiconductor device is sealed by applying liquid resin 3 to a region containing leads (inner lead sections) 2 above a semiconductor chip 1 after ILB (inner lead bonding) is executed and then curing the resin 3 by heat treatment. This method enables the semiconductor device to be thinned greatly.

A carrier tape used in the TCP type semiconductor device is called a TAB (tape automated bonding) tape (TAB type lead frame). The carrier tape is constituted as follows. Copper foil is laminated on an insulating film of polyimide or the like and then photoetched to form leads each having an inner lead section and an outer lead section (wiring pattern). The carrier tape having such a constitution is generally flexible and suitable for mounting a semiconductor device on a printed circuit board.

Since, however, the carrier tape is easy to be bent or distorted, its flatness is difficult to maintain. If the bend or distortion of the carrier tape adversely affects the flatness of the outer lead sections, no semiconductor device can be mounted stably. If the flatness of the outer lead sections is lost, it becomes more difficult to mount the semiconductor device on a printed circuit board by reflow soldering, resulting in failure in mounting.

To cope with the above problem, for example, Jpn. Pat. Appln. KOKAI Publication No. 3-125440 discloses securing the flatness of a carrier tape by providing the carrier tape with a reinforcing plate. However, in the ILB of the TCP type semiconductor device described above, connecting electrodes 4 such as gold bumps are formed on the electrode pads of the semiconductor chip 1, and the inner lead sections of the leads 2 of the carrier tape are bonded to the connecting electrodes 4 by thermocompression bonding. For this reason, they can be bonded in a relatively stable state when the number of leads 2 is large, but they cannot be bonded stably when the number is small. If the bonding is unstable, the connecting electrodes 4 come off, or the flatness of the carrier tape cannot be maintained.

SUMMARY OF THE INVENTION

An object of the present invention is to provide a semiconductor device capable of maintaining the flatness of a lead frame and being stably mounted on a printed circuit board, and a method for manufacturing the same.

According to a first aspect of the present invention, there is provided a semiconductor device wherein a non-contact portion of a lead frame mounted with a semiconductor chip, which is separate from each of chip electrodes, is adhered to a surface of the semiconductor chip.

According to a second aspect of the present invention, there is provided a semiconductor device comprising:

a semiconductor chip on a surface of which at least one electrode is provided;

a lead frame;

connecting members each for electrically connecting the lead frame and at least one the electrode of the semiconductor chip; and an adhesive member for adhering a non-contact portion of the lead frame, which is separate from at least one electrode of the semiconductor chip, to the surface of the semiconductor chip.

According to a third aspect of the present invention, there is provided a semiconductor device comprising:

a semiconductor chip having at least one electrode in a central part of a surface of the semiconductor chip;

an insulating film having an opening which is smaller than the semiconductor chip;

a wiring pattern including leads formed on one of a surface and an undersurface of the insulating film, each of the leads having an inner lead section connected to the electrode of the semiconductor chip and an outer lead section extended from the inner lead section;

connecting electrodes each for electrically connecting the inner lead section and at least one electrode of the semiconductor chip within the opening of the insulating film; and an adhesive layer for adhering one of the insulating film and the lead formed on the undersurface of the insulating film to the surface of the semiconductor chip.

According to a fourth aspect of the present invention, there is provided a semiconductor device comprising:

a semiconductor chip on a surface of which at least one electrode is provided;

a wiring pattern constituted by leads each having an inner lead section connected to at least one electrode of the semiconductor chip and an outer lead section extended from the inner lead section;

connecting electrodes each for electrically connecting the inner lead section and at least one electrode of the semiconductor chip; and an adhesive layer for adhering the leads of the wiring pattern to the surface of the semiconductor chip.

According to a fifth aspect of the present invention, there is provided a method for manufacturing a semiconductor device wherein a non-contact portion of a lead frame mounted with a semiconductor chip, which is separate from each of chip electrodes, is adhered to a surface of the semiconductor chip.

According to a sixth aspect of the present invention, there is provided a method for manufacturing a semiconductor device, comprising the steps of:

electrically connecting an electrode of a semiconductor chip and a lead frame by a connecting member; and adhering a non-contact portion of the lead frame, which is separate from the electrode of the semiconductor chip, to a surface of the semiconductor chip by an adhesive member.

According to a seventh aspect of the present invention, there is provided a method for manufacturing a semiconductor device, comprising the steps of:

electrically connecting an electrode provided in a central part of a surface of a semiconductor chip to an inner lead section of a lead by thermocompression by interposing a connecting electrode therebetween, the lead being formed on one of a surface and an undersurface of an insulating film, having an outer lead section as well as the inner lead section, and forming a wiring pattern; and adhering one of the insulating film and the lead formed on the undersurface of the insulating film to the surface of the semiconductor chip by an adhesive layer.

According to an eighth aspect of the present invention, there is provided a method for manufacturing a semiconductor device, comprising the steps of:

electrically connecting an electrode provided on a surface of a semiconductor chip to an inner lead section of a lead by thermocompression by interposing a connecting electrode therebetween, the lead having an outer lead section as well as the inner lead section, and forming a wiring pattern; and adhering the lead of the wiring pattern to the surface of the semiconductor chip by an adhesive layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described, with reference to the accompanying drawings.

Figure 2A:
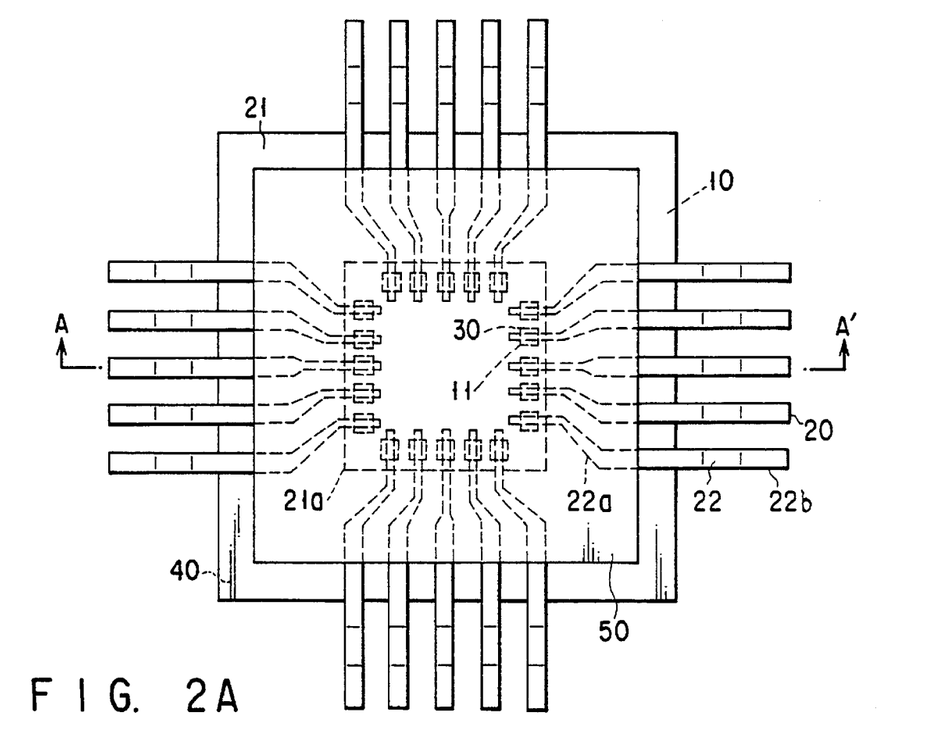
FIG. 2A is a plan view schematically showing a constitution of a TCP type semiconductor device according to a first embodiment of the present invention.
Figure 2B:
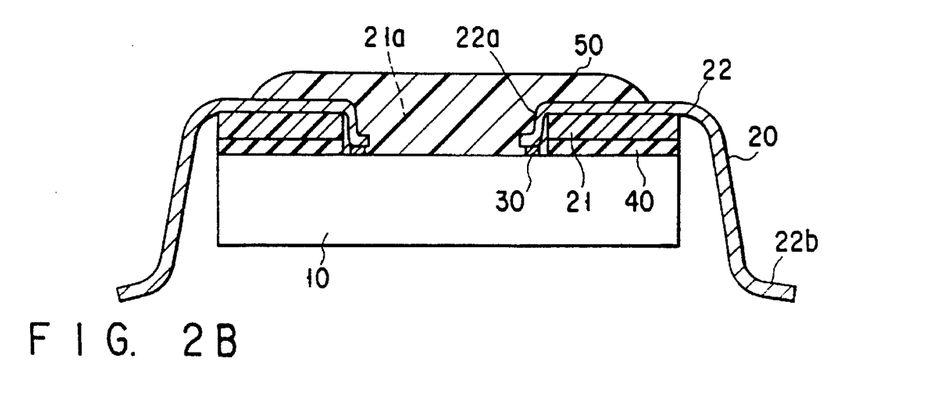
FIG. 2B is a cross-sectional view schematically showing the constitution of the TCP type semiconductor device shown in FIG. 2A.

FIG. 2A is a plan view schematically showing a constitution of a TCP type semiconductor device according to a first embodiment of the present invention, and FIG. 2B is a cross-sectional view taken along the line of A–A' of FIG. 2A.

The semiconductor device according to the first embodiment includes a semiconductor chip 10 on which, for example, an integrated circuit is formed, a carrier tape (TAB type lead frame) 20 mounted with the semiconductor chip 10, connecting electrodes 30 constituted by gold (Au) bumps serving as connecting members for connecting leads (wiring pattern) 22 of the carrier tape 20 and electrode pads 11 formed on the semiconductor chip 10, an adhesive layer 40 serving as an adhesive member for adhering the carrier tape 20 to the surface of the semiconductor chip 10, and sealing resin 50 for sealing the surface of the semiconductor chip 10 with resin.

The semiconductor chip 10 is, for example, a semiconductor memory device such as a dynamic RAM (DRAM) having a relatively small number of electrode pads. The electrode pads 11 are arranged near the central part of the surface of the chip 10.

The carrier tape 20 has a three-layered structure in which copper (Cu) foil for forming the leads 22 is adhered to a flexible insulating film 21 of polyimide or the like by an epoxy adhesive (not shown). This structure will be described in detail later.

As shown in FIG. 2B, each of the leads 22 has an inner lead section 22a and an outer lead section 22b extended from the inner lead section. The end of the inner lead section 22a is connected to each of the electrode pads 11 on the semiconductor chip 10. The outer lead section 22b has a predetermined shape such that the lead can be easily bonded to the printed circuit board (not shown).

The connecting electrodes 30 are formed on their respective electrode pads 11 of the semiconductor chip 10, and connect the electrode pads 11 to the inner lead sections 22a of the leads 22 of the carrier tape 20 by thermocompression bonding.

The adhesive layer 40 is used to adhere the insulating film 21, which is a non-contact portion of the carrier tape 20, to the surface of the semiconductor chip 10 by thermocompression bonding or the like, and constituted by, for example, a thermoplastic adhesive, a thermosetting adhesive, or their mixture.

The sealing resin 50 is formed of, for example, liquid epoxy resin. This epoxy resin is applied to the semiconductor chip 10 and cured by heat treatment, thereby sealing a region above the semiconductor chip 10 so as to cover the inner lead sections 22a of the leads 22.

Figure 3:
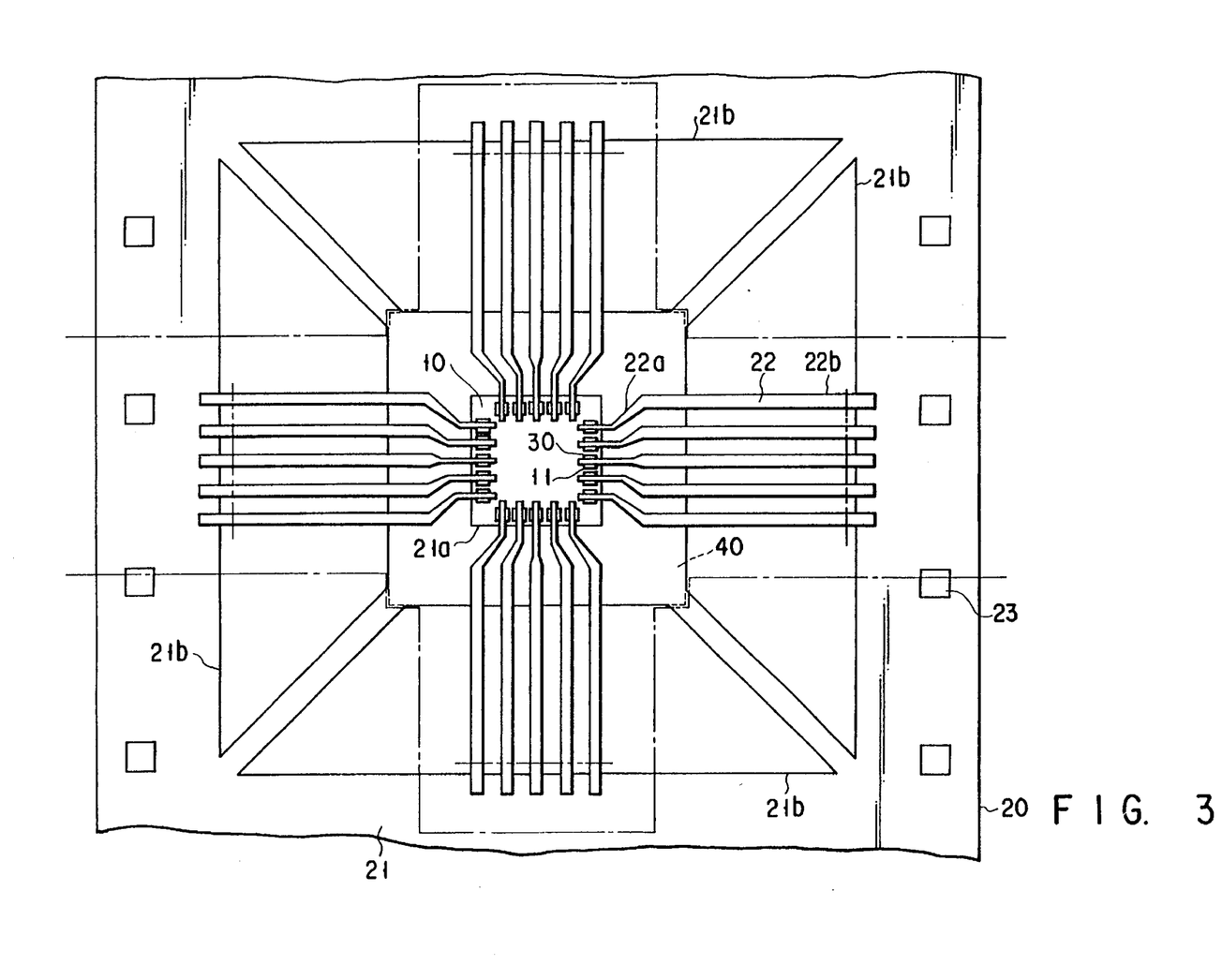
FIG. 3 is a plan view of a carrier tape used in the TCP type semiconductor device shown in FIGS. 2A and 2B.

A method for manufacturing a semiconductor device according to the first embodiment will now be described, with reference to FIG. 3. The carrier tape 20 shown in FIG. 3 has been neither cut nor distributed to respective semiconductor devices.

The insulating film 21 constituting the carrier tape 20 is a band-like member and has a thickness of 75 μm. Moving holes 23 for moving the carrier tape 20 in the longitudinal direction of the insulating film 21, are arranged at regular intervals at both ends thereof.

A first opening 21a for mounting the semiconductor chip 10 is formed in substantially the central part of the insulating film 21. The opening 21 is virtually square, and its dimension is smaller than the overall dimension of the semiconductor chip 10.

Trapezoidal second openings 21b are formed on the insulating film 21 so as to face the respective sides of the square opening 21a and to surround the opening 21a.

Furthermore, a wiring pattern is formed on the insulating film 21. This wiring pattern is obtained by adhering copper foil having a thickness of, e.g., 30 μm onto the surface of the insulating film 21 by an adhesive and then patterning the copper foil by photoetching.

The wiring pattern includes a plurality of leads 22 each having an inner lead section 22a and an outer lead section 22b. The end of the inner lead section 22a projects into the opening 21a, and part of the outer lead section 22b is exposed to the second opening 21b. The leads 22 are plated with tin.

To manufacture the semiconductor device according to the first embodiment, the semiconductor chip 10 and carrier tape 20 are positioned, and then ILB (inner lead bonding) is executed at once. In the ILB, the electrode pads 11 and inner lead sections 22a are aligned with each other, and the inner lead sections 22a are compression-bonded to their respective connecting electrodes 30 melted at a temperature of about 500° C., by using a tool (not shown) or the like.

Then the insulating film 21 of the carrier tape 20 is adhered to the surface of the semiconductor chip 10 by means of an adhesive layer 40 having a thickness of, e.g., 40 μm. More specifically, the adhesive layer 40 is heated at a temperature of, e.g., 175° C. for about one second to be melted. The melted layer is cooled naturally at a normal temperature, and heated again at a temperature of 150° C. for about two hours, thereby curing the adhesive layer 40.

Since the ILB is executed prior to the adhesion of the insulating film 21 to the surface of the semiconductor chip 10, a failure in ILB due to a shift in position between the chip 10 and carrier tape 20 can be prevented. More specifically, since the insulating film 21 and adhesive layer 40 are distorted by thermal expansion or thermal contraction in the adhesion of the film 21 and chip 10, the leads 22 of the carrier tape 20 are easy to be deformed. It is thus difficult to align the deformed leads 22 with the electrode pads 11, with the result that the ILB cannot be executed in a stable manner.

As described above, if the insulating film 21 is adhered to the surface of the semiconductor chip 10 after the inner lead sections 22a are bonded to their respective electrode pads 11, the inner lead sections 22a and electrode pads 11 can be bonded more stably. Since, furthermore, the flatness of the surface of the semiconductor chip 10 is high, the flatness of the carrier tape 20 can easily be maintained on the surface of the chip 10.

If the adhesion of the insulating film 21 to the surface of the semiconductor chip 10 is completed, the surface of the chip 10 is sealed with resin (not shown) by the sealing resin 50. For example, the sealing resin 50 covers the opening 21a of the insulating film 21 and also its surrounding region. After that, the forming of the leads 22 is performed to complete the semiconductor device shown in FIGS. 2A and 2B.

The forming of the leads 22 is as follows. The leads 22 on the insulating film 21 are grouped for each side of the semiconductor chip 10. Then the grouped leads are shaped at once and cut away from the insulating film 21. More specifically, as shown in FIG. 3, the insulating film 21 is cut along a one-dot-one-dash line to divide the carrier tape 20 for each individual semiconductor device and group the leads 22 of the carrier tape 20 for each side of the semiconductor chip 10. The grouped leads 22 corresponding to the four sides of the chip 10, are shaped at once and then cut along a two-dot-one-dash line. Since, in this case, the leads 22 can be shaped without any deformation and the flatness of the carrier tape 20 is maintained on the surface of the chip 10, the flatness of the outer lead sections 22b of the shaped leads 22 is hard to deteriorate, and the stable mounting of the semiconductor device can be achieved.

According to the semiconductor device of the first embodiment having the foregoing structure, even if the number of electrode pads is small, the mechanical strength (stability) of bonding can be enhanced and the flatness of the carrier tape 20 can easily be maintained. Therefore, the stable mounting of the semiconductor device on the printed circuit board can be improved.

Moreover, in the semiconductor device of the first embodiment, the electrode pads 11 are arranged near the central part of the surface of the semiconductor chip 10. The carrier tape 20 can thus be shifted toward the center of the chip 10, and the semiconductor device can be greatly miniaturized.

The area where the electrode pads 11 are arranged, is not limited to the vicinity of the central part of the chip 10. If the electrode pads 11 can be bonded to the inner lead sections 22a when the insulating film 21 is located on the surface of the chip 10, the electrode pads can be arranged anywhere. For example, the electrode pads 11 can be bonded to the inner lead sections 22a at the peripheral portion of the semiconductor chip 10, and the insulating film 21 can be adhered to the central part of the chip 10, though not shown.

Figure 4A:
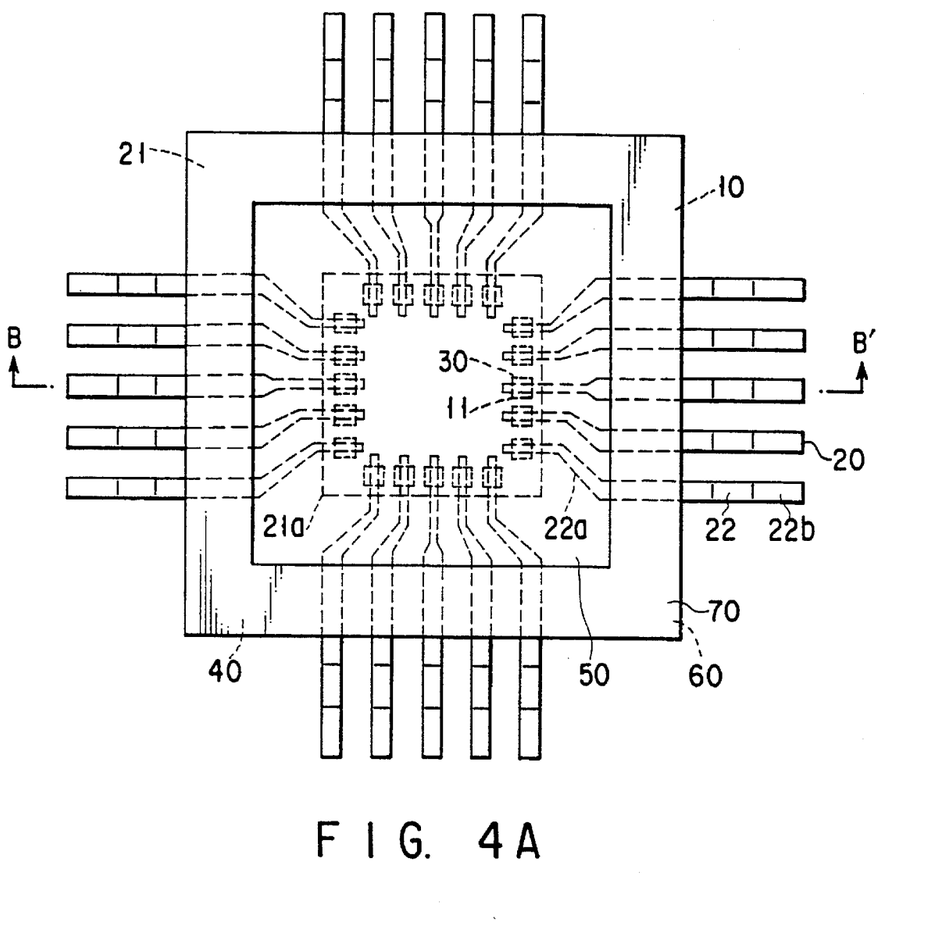
FIG. 4A is a plan view of a modification to the TCP type semiconductor device shown in FIGS. 2A and 2B which includes a metallic member.
Figure 4B:
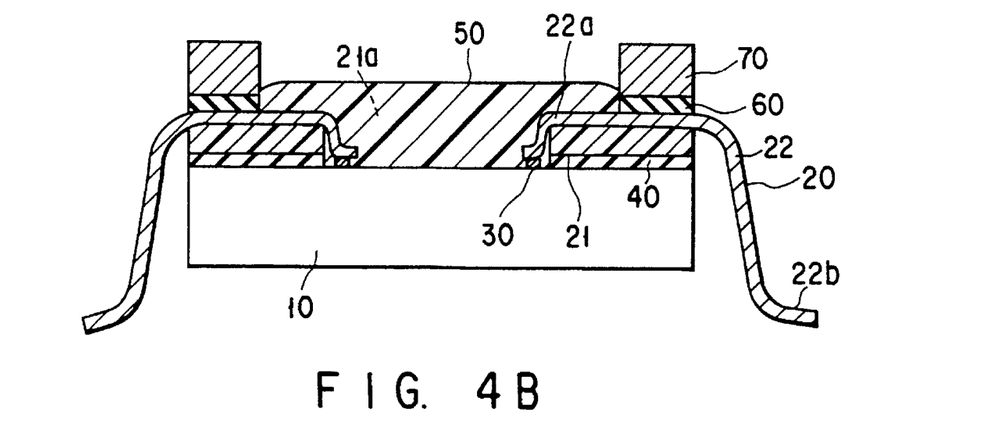
FIG. 4B is a cross-sectional view of the modification to the TCP type semiconductor device shown in FIG. 4A.

FIGS. 4A and 4B show a modification to the semiconductor device according to the first embodiment in which a metallic member 70 of good radiation characteristic is formed on the leads 22 by interposing an adhesive 60 between them. If, for example, a hollowed rectangular metallic plate of the same size as that of the semiconductor chip 10 is used for the metallic member 70, not only the radiation characteristic of the semiconductor device is improved, but also the sealing resin 50 is prevented from flowing out of the device.

Figure 5A:
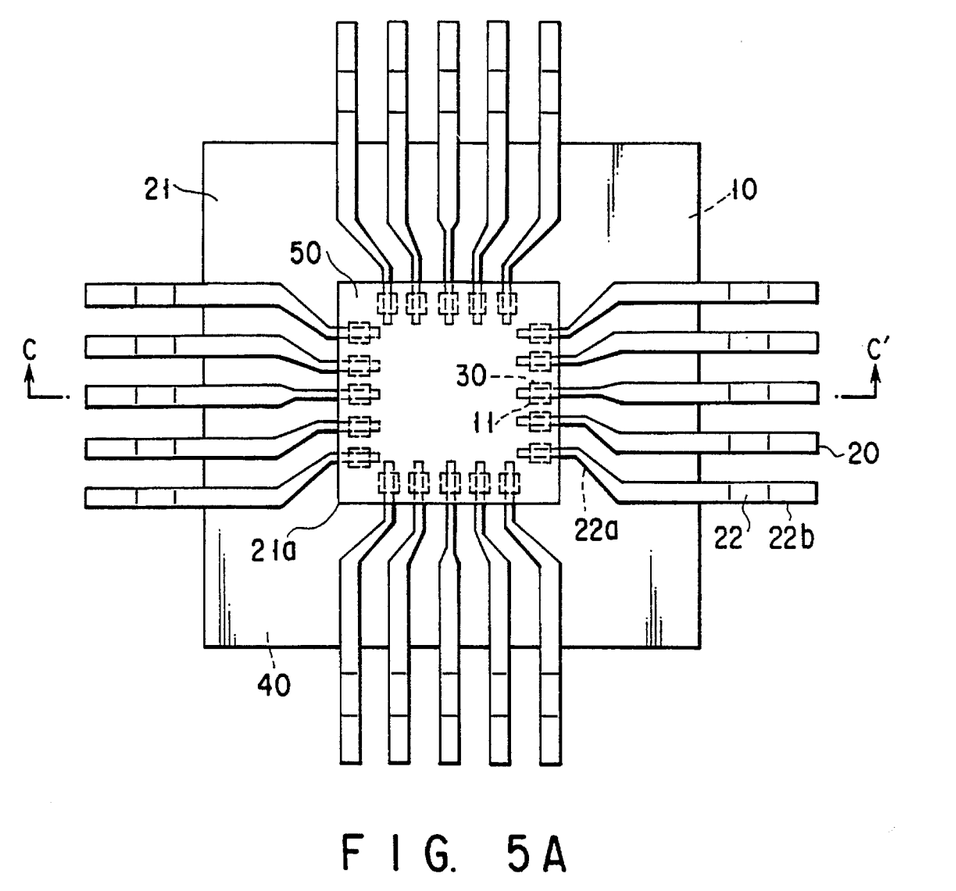
FIG. 5A is a plan view of another modification to the TCP type semiconductor device shown in FIGS. 2A and 2B, which shows another example of sealing.
Figure 5B:
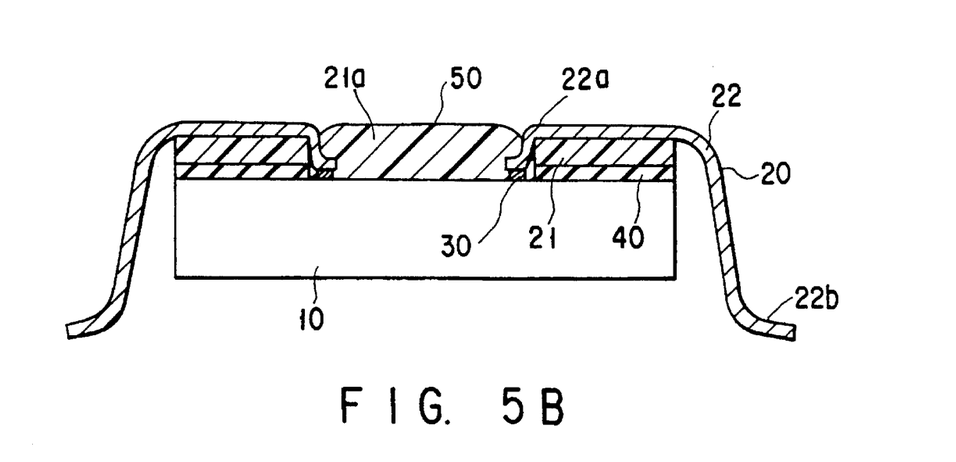
FIG. 5B is a cross-sectional view of the modification to the TCP type semiconductor device shown in FIG. 5A.

FIGS. 5A and 5B show another modification to the semiconductor device according to the first embodiment in which only the first opening 21a of the insulating film 21 is sealed with the sealing resin 50 on the surface of the semiconductor chip 10. According to this modification, the same advantage as that of the first embodiment can be obtained, and the amount of resin can be decreased, with the result that the semiconductor device can be thinned further.

Figure 6A:
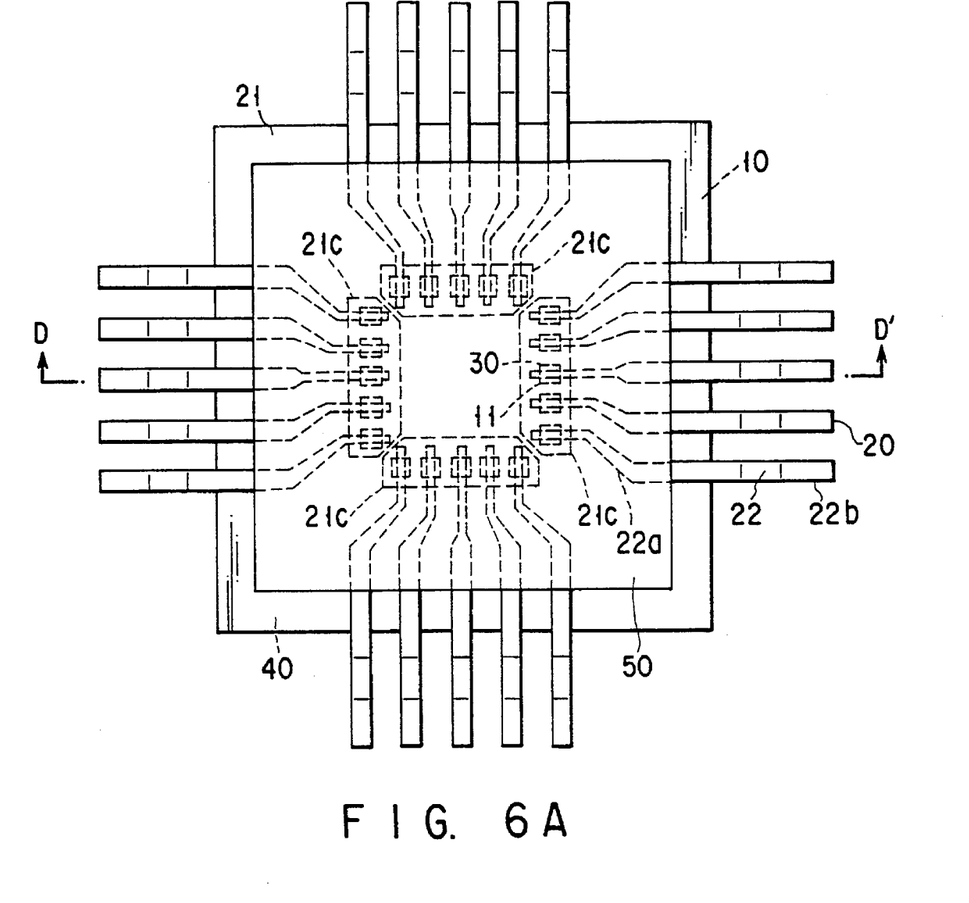
FIG. 6A is a plan view of still another modification to the TCP type semiconductor device shown in FIGS. 2A and 2B, which shows another example of ILB processing.
Figure 6B:
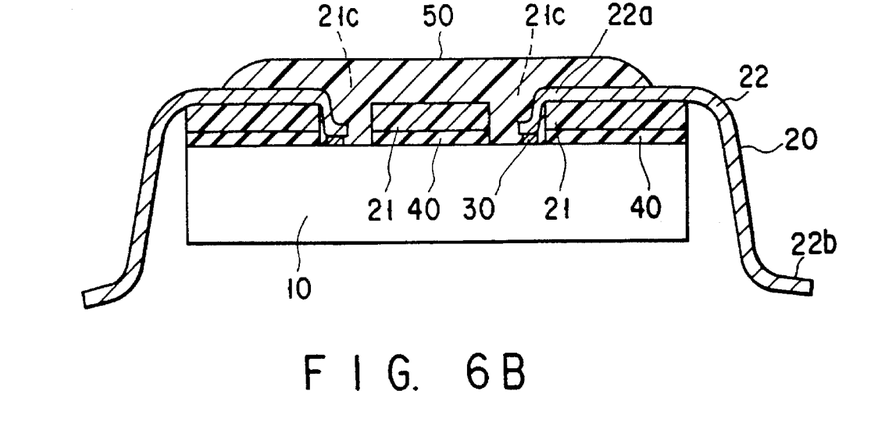
FIG. 6B is a cross-sectional view of the modification to the TCP type semiconductor device shown in FIG. 6A.

FIGS. 6A and 6B show still another modification to the semiconductor device according to the first embodiment in which the first opening 21a is divided into four openings 21c corresponding to four sides of the chip 10, and the electrode pads 11 and the inner lead sections 22a of the leads 22 are bonded to each other within each of the openings 21c. Since the whole region of the insulating film 21 except the openings 21c is adhered to the surface of the semiconductor chip 10, the adhesion of the carrier tape 20 to the surface of the chip can be increased, compared with the first embodiment. Thus, the flatness of both the carrier tape 20 and outer leads 22b of the leads 22 can be maintained more easily.

The modifications to the semiconductor device according to the first embodiment of the present invention have been described. The following are semiconductor devices according to the other embodiments of the present invention.

Figure 7A:
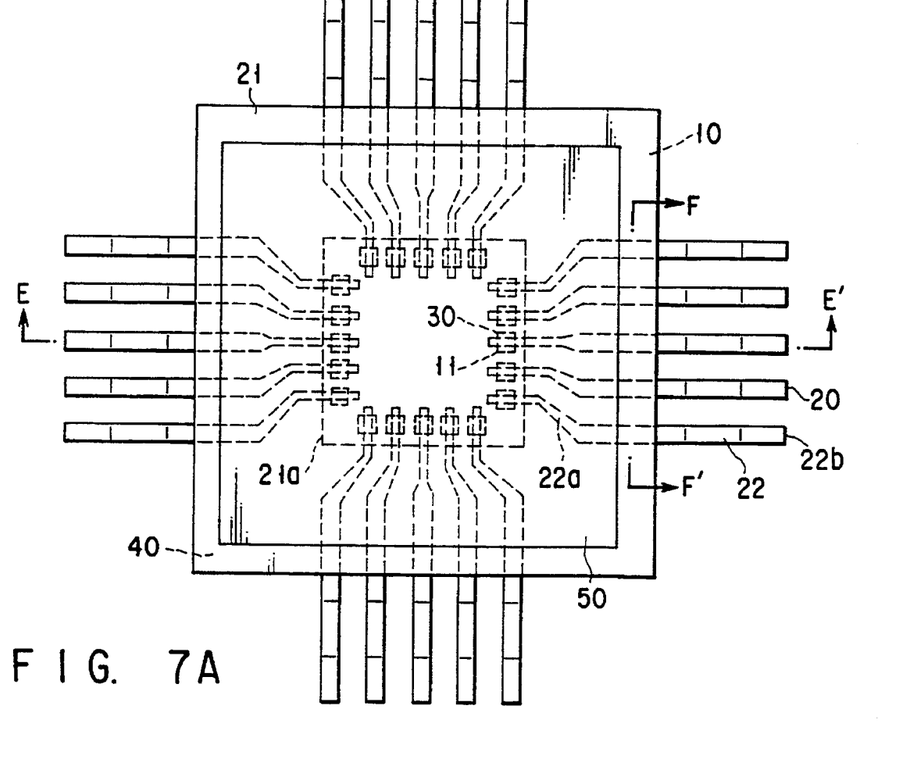
FIG. 7A is a plan view schematically showing a constitution of a TCP type semiconductor device according to a second embodiment of the present invention.
Figure 7B:
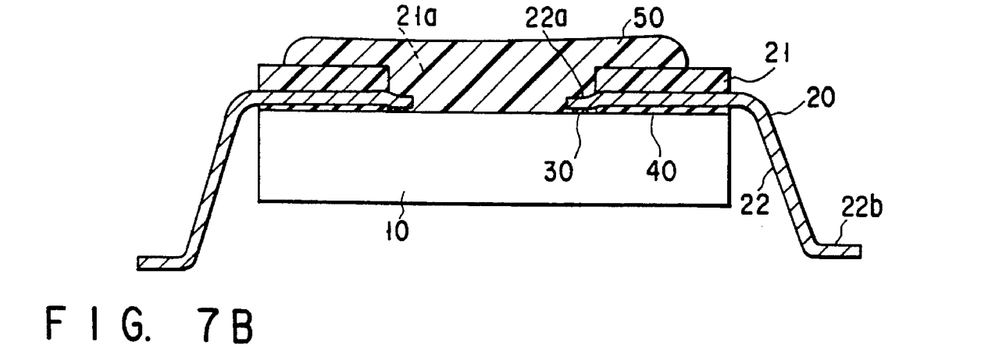
FIG. 7B is a cross-sectional view schematically showing the constitution of the TCP type semiconductor device shown in FIG. 7A.
Figure 8:
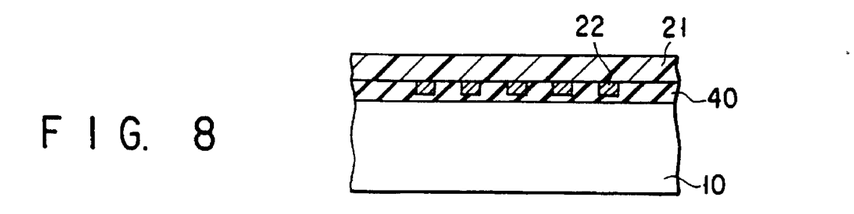
FIG. 8 is a cross-sectional view taken along the line of F–F' of the TCP type semiconductor device shown in FIGS. 7A and 7B.

FIG. 7A is a plan views schematically showing a constitution of a TCP type semiconductor device according to a second embodiment of the present invention, and FIG. 7B is a cross-sectional view taken along the line of E–E' of FIG. 7A. FIG. 8 is also a cross-sectional view taken along the line of F–F' of FIG. 7A.

The constitution of the TCP type semiconductor device of the second embodiment is basically the same as that of the device of the first embodiment, except that the carrier tape 20 is reversed and thus the non-contact portions of the leads 22 are adhered to the surface of the semiconductor chip 10.

The same advantage as that of the first embodiment can be obtained from the second embodiment. In addition, since the insulating film 21 is formed on the leads 22, a short circuit due to dust attached to the device mounted on the printed circuit board, can be prevented from occurring between the leads 22.

In the semiconductor device of the second embodiment, as shown in FIG. 8, the leads 22 are buried into the adhesive layer 40 and accordingly an adhesive is interposed between the leads. It is thus possible to effectively prevent moisture (water) from entering through between the leads 22 and improve the insulation properties between them.

Like in the first embodiment, only the opening 21a of the insulating film 21 can be sealed with the sealing resin 50, and four openings 21c can be formed in the insulating film 21 and the ILB can be executed within each of the openings 21c (not shown).

Figure 9A:
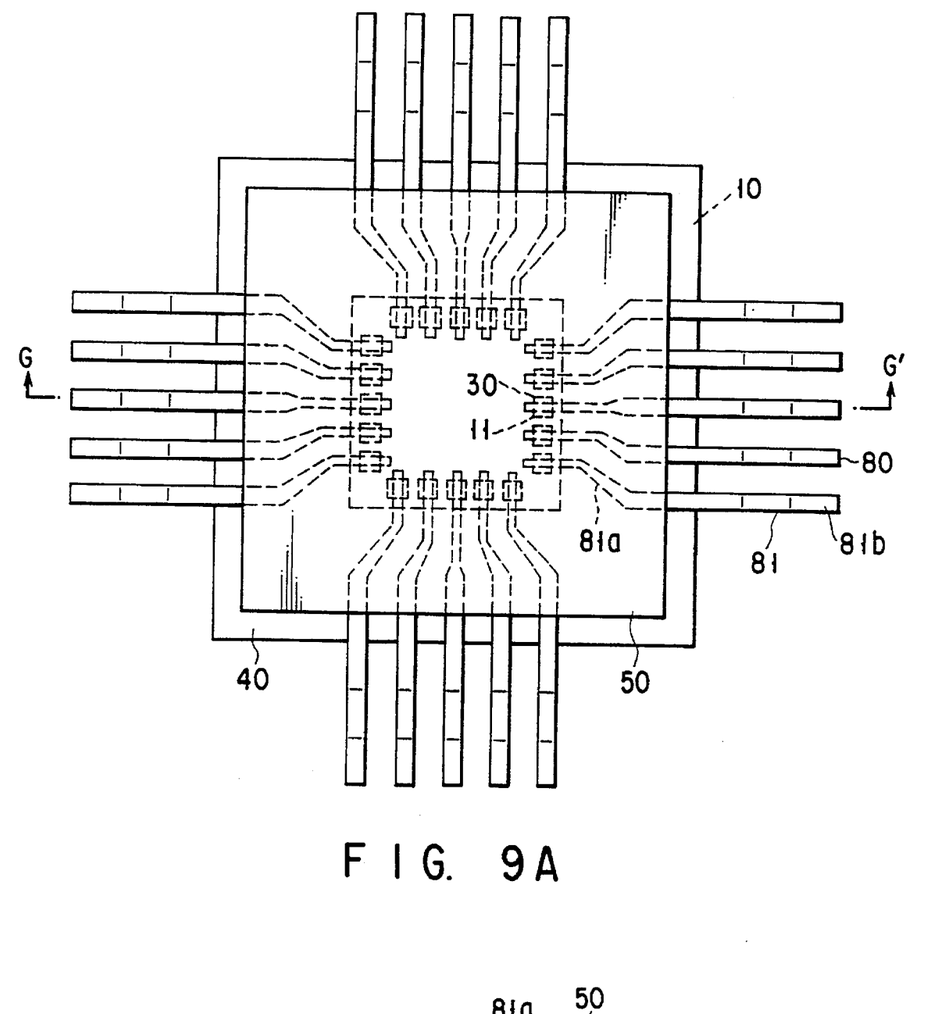
FIG. 9A is a plan view schematically showing a constitution of a TCP type semiconductor device according to a third embodiment of the present invention.
Figure 9B:
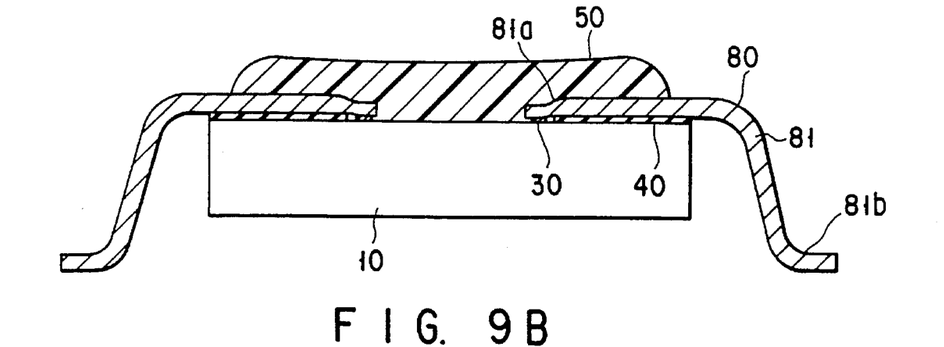
FIG. 9B is a cross-sectional view schematically showing the constitution of the TCP type semiconductor device shown in FIG. 9A.

FIG. 9A is a plan view schematically showing a constitution of a TCP type semiconductor device according to a third embodiment of the present invention, and FIG. 9B is a cross-sectional view taken along the line of G–G' of FIG. 9A.

The constitution of the semiconductor device according to the third embodiment is basically the same as those of the devices according to the first and second embodiments, except that a one-layered carrier tape 80 free of an equivalent for the insulating film 21 is used in place of the carrier tape 20. Since leads 81 can be obtained from the carrier tape 80 by etching both sides of copper foil or patterning the copper foil, they are thicker than the leads 22 of the carrier tape 20 of the first and second embodiments. Therefore, the strength of the leads 81 can be increased and accordingly the flatness of the carrier tape 80 can be easily maintained.

In the third embodiment, the flatness of the carrier tape 80 can be maintained more easily than in the first and second embodiments, and the finished semiconductor device can be thinned since the carrier tape 80 includes no insulating films.

Like in the second embodiment, moisture can be reliably prevented from entering through between the leads 81, and the insulation properties between them can be improved. Furthermore, as in the first embodiment, an equivalent for the metallic member 70 can be formed on the leads 81, though it is not shown.

To manufacture the semiconductor device according to the third embodiment, the inner lead sections 81a of the leads 81 have to be bonded to the electrode pads 11 on the semiconductor chip 10 by the ILB before the carrier tape 80 is adhered to the surface of the semiconductor chip 10. The carrier tape 80 is not so deformed as the carrier tape 20 by the heat treatment carried out when the carrier tape 20 and chip 10 are adhered to each other. If, however, the adhesion precedes the heat treatment, tin plating applied to the leads 81 is melted by the heat treatment performed in the ILB, with the result that the adhesion of the adhesive layer 40 may be lowered.

The leads 81 of the carrier tape 80 are formed integrally with each other. To satisfactorily perform forming of the leads 81, the carrier tape 80 is cut for each individual semiconductor device, the leads 81 are grouped for each side of the chip 10, and the grouped leads are shaped at once. The grouped leads are separeted from one another.

Figure 10A:
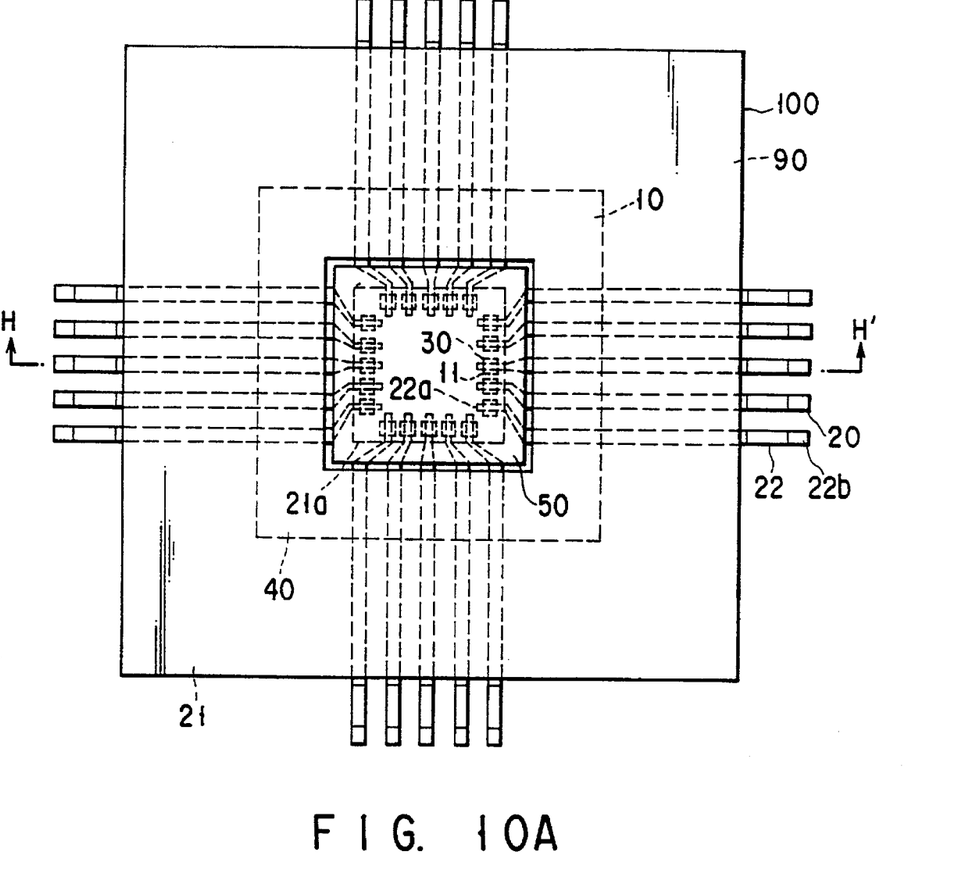
FIG. 10A is a plan view schematically showing a constitution of a TCP type semiconductor device according to a fourth embodiment of the present invention.
Figure 10B:
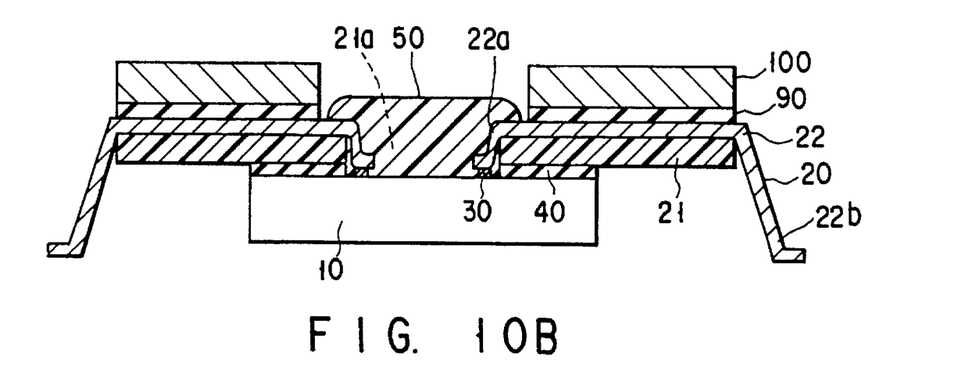
FIG. 10B is a cross-sectional view schematically showing the constitution of the TCP type semiconductor device shown in FIG. 10A.

FIG. 10A is a plan view schematically showing a constitution of a TCP type semiconductor device according to a fourth embodiment of the present invention, and FIG. 10B is a cross-sectional view taken along the line of H–H' of FIG. 10A.

The semiconductor device of the fourth embodiment is so constructed that the leads 22 are extended and the insulating film 21 is expanded outside the semiconductor chip 10 in order to meet the standard of shape established by the EIAJ (Electronic Industries Association of Japan). In this construction, part of the insulating film 21 is adhered to the surface of the semiconductor chip 10 by interposing the adhesive layer 40 between them. To enhance the flatness of the carrier tape 20, a hollowed, rectangular, metallic reinforcing plate 100 is adhered onto the leads 22 by an adhesive 90. More specifically, the metallic reinforcing plate 100 is adhered to the leads 22 by thermocompression bonding after the inner lead sections 22a of the leads 22 are bonded to the electrode pads 11 of the chip 10 and before the insulating film 21 is adhered to the surface of the chip 10.

According to the fourth embodiment, the carrier tape 20 is adhered to the surface of the chip 10 in addition to the metallic reinforcing plate 100. Thus the leads 22 of the tape 20 can be prevented from being irregularly formed, and the flatness of the carrier tape 20, which is not sufficient for mounting the semiconductor chip 10, can be maintained more reliably.

Moreover, the metallic reinforcing plate 100 not only increases in radiation effect of the semiconductor device but also prevents the sealing resin 50 from flowing out.

Figure 11A:
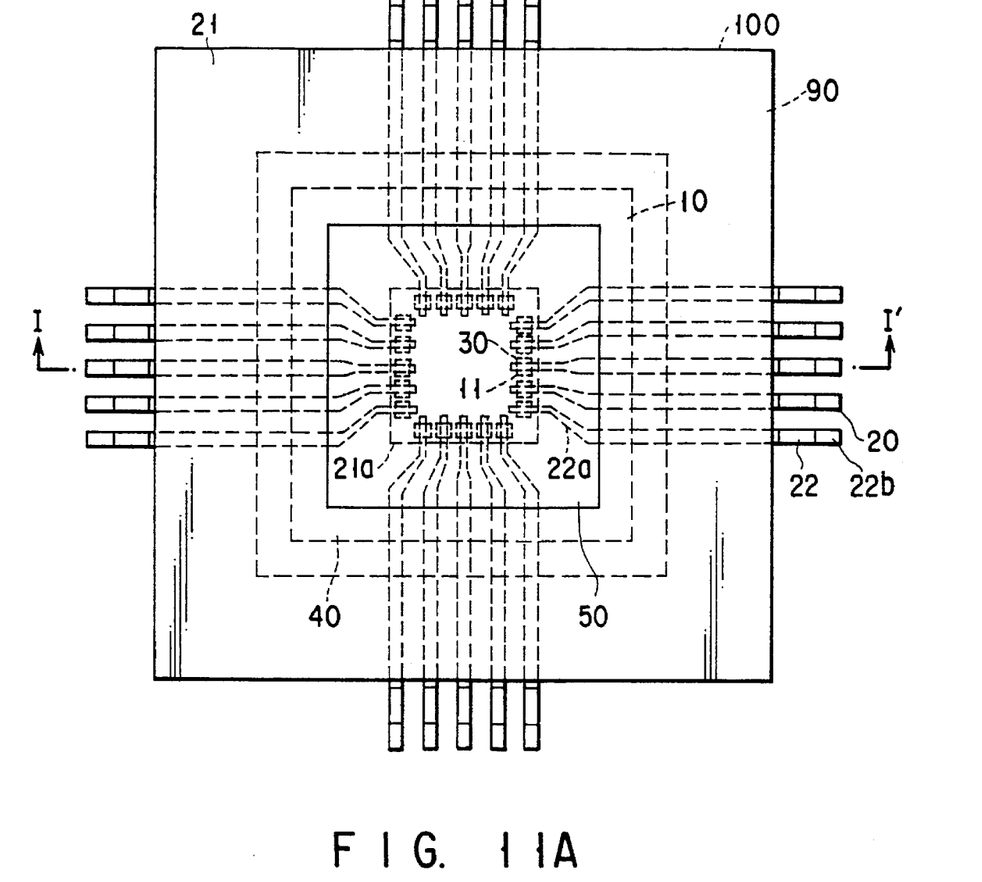
FIG. 11A is a plan view schematically showing a constitution of a TCP type semiconductor device according to a fifth embodiment of the present invention.
Figure 11B:
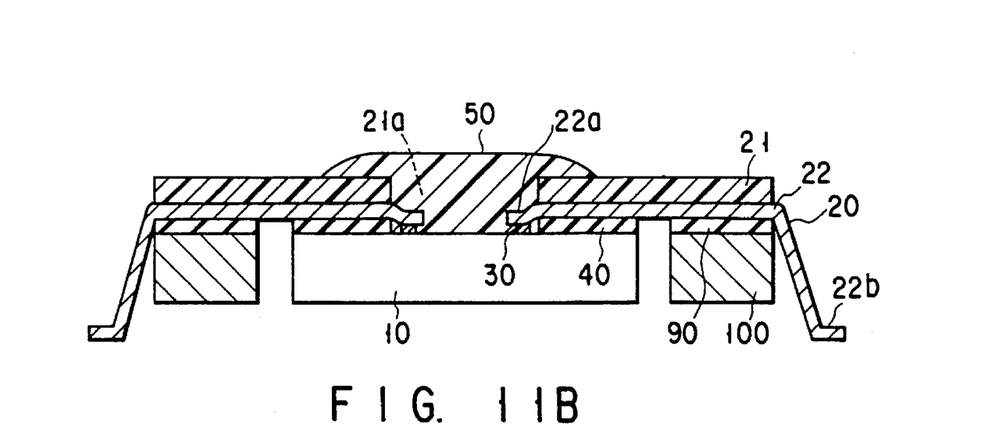
FIG. 11B is a cross-sectional view schematically showing the constitution of the TCP type semiconductor device shown in FIG. 11A.

FIG. 11A is a plan view schematically showing a constitution of a TCP type semiconductor device according to a fifth embodiment of the present invention, and FIG. 11B is a cross-sectional view taken along the line of I–I' of FIG. 11A.

The semiconductor device of the fifth embodiment has substantially the same constitution as that of the device of the fourth embodiment in order to meet the standard of shape established by the EIAJ. The only difference is that the device of the fifth embodiment is so constructed that the carrier tape 20 is reversed, and the insulating film 21 extending outside the semiconductor chip 10 is formed on the leads 22 of the tape 20.

More specifically, according to the fifth embodiment, part of each lead 22 is adhered to the surface of the semiconductor chip 10 by an adhesive layer 40. A metallic reinforcing plate 100 is adhered to the underside of the lead 22 by an adhesive 90 so as to surround the semiconductor chip 10 in order to enhance the flatness of the carrier tape 20. As in the fourth embodiment, the metallic reinforcing plate 100 is formed like a hollowed rectangular frame and has such a thickness as to fall within the length of each outer lead section 22b of the shaped leads 22.

The same advantage as that of the fourth embodiment can be obtained from the fifth embodiment. By providing the metallic reinforcing plate 100 under the carrier tape 20, the device of the fifth embodiment can be made thinner than that of the fourth embodiment. If the thickness of the metallic reinforcing plate 100 is set equal to that of the semiconductor chip 10, their undersurfaces can be flush with each other. Therefore, the processibility of the semiconductor device can be improved at the subsequent step of adhering the leads 22 to the surface of the chip 10.

According to all the embodiments described above, the leads of the carrier tape are arranged on four sides of the semiconductor chip. However, they can be arranged on opposite two sides thereof.

The present invention is not limited to the TCP type semiconductor device using a carrier tape, but can be applied to a semiconductor device using a normal lead frame having leads which are formed by etching or patterning a copper plate.

It is needless to say that the present invention can be applied to a semiconductor chip having a relatively large number of electrode pads.

Various changes and modifications can be made without departing from the scope and spirit of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising:

a first step of electrically connecting each of a plurality of connecting electrodes formed on a semiconductor chip to a corresponding one of a plurality of lead end portions of each of a plurality of leads of a lead frame; and a second step, following said first step, of fixing part of each of said plurality leads extending on said semiconductor chip to a surface of said semiconductor chip by an adhesive member.

2. The method according to claim 1, wherein said plurality of leads is constituted by a wiring pattern formed of foil provided on an insulating film by interposing an adhesive layer therebetween.

3. The method according to claim 2, wherein said insulating film is adhered to the surface of said semiconductor chip by said adhesive member to fix each of said plurality of leads to the surface of said semiconductor chip.

4. The method according to claim 2, wherein each of said plurality of leads is adhered to the surface of said semiconductor chip by said adhesive member to fix part of each of said plurality of leads to the surface of said semiconductor chip.

5. The method according to claim 1, wherein said plurality of leads is constituted by a wiring pattern formed of foil.

6. A method for manufacturing a semiconductor device, comprising:

a first step of electrically connecting each of a plurality of connecting electrodes provided in a central part of a surface of a semiconductor chip to an inner lead section of a corresponding one of each of a plurality of leads by thermocompression, said leads being formed on one of a surface and an undersurface of an insulating film and having an outer lead section as well as the inner lead section; and a second step, following said first step, of adhering one of said insulating film and each of said plurality of leads formed on the undersurface of said insulating film to the surface of said semiconductor chip by an adhesive layer.

7. The method according to claim 6, further comprising an insulation sealing member provided on the surface of said semiconductor chip.

8. The method according to claim 7, wherein said insulation sealing member is constituted by resin and covers the opening of said insulating film.

9. The method according to claim 7, wherein said insulation sealing member is constituted by resin and provided only in the opening of said insulating film.

10. The method according to claim 6, wherein said plurality of leads formed on the undersurface of said insulating film is buried in said adhesive layer.

11. The method according to claim 6, wherein said plurality of leads is provided with a metallic member.

12. The method according to claim 11, wherein said metallic member is provided on said plurality of leads formed on the surface of said insulating film.

13. The method according to claim 12, wherein said metallic member provided on said plurality of leads formed on the surface of said insulating film is equal in size to said semiconductor chip and shaped like a frame having a rectangular hollow in a central part thereof.

14. The method according to claim 11, wherein said metallic member is provided under said plurality of leads formed on the undersurface of said insulating film.

15. The method according to claim 14, wherein said metallic member provided under said plurality of leads formed on the undersurface of said insulating film, has a thickness which is shorter than a length of a shaped outer lead section of said plurality of leads.

16. The method according to claim 14, wherein said metallic member provided under said plurality of leads formed on the undersurface of said insulating film has a thickness which is equal to a thickness of said semiconductor chip.

17. A method for manufacturing a semiconductor device, comprising:

a first step of electrically connecting each of plurality of connecting electrodes provided on a surface of a semiconductor chip to an inner lead section of a corresponding one of each of a plurality of leads by thermocompression, said leads having an outer lead section as well as the inner lead section; and a second step, following said first step, of adhering each of said plurality of leads to the surface of said semiconductor chip by an adhesive layer.

18. The method according to claim 17, further comprising an insulation sealing member of resin provided on the surface of said semiconductor chip.

19. The method according to claim 17, wherein said plurality of leads is buried in said adhesive layer.

20. The method according to claim 7, wherein said insulation sealing member and said adhesive layer are constituted of a same material.

21. The method according to claim 18, wherein said insulation sealing member and said adhesive layer are constituted of a same material.

\* \* \* \* \*